(12) United States Patent
Askeland et al.

(10) Patent No.: US 6,914,779 B2
(45) Date of Patent: Jul. 5, 2005

(54) CONTROLLING THERMAL, ACOUSTIC, AND/OR ELECTROMAGNETIC PROPERTIES OF A COMPUTING DEVICE

(75) Inventors: Roy James Askeland, Los Altos, CA (US); J. David Egner, Hollister, CA (US)

(73) Assignee: Microsoft Corporation, Redmond, WA (US)

(*) Notice: Subject to any disclaimer, the term of this patent is extended or adjusted under 35 U.S.C. 154(b) by 162 days.

(21) Appl. No.: 10/077,385

(22) Filed: Feb. 15, 2002

(65) Prior Publication Data

US 2003/0156385 A1 Aug. 21, 2003

(51) Int. Cl.$^7$ ............................................... H05K 7/20
(52) U.S. Cl. .................... 361/687; 361/695; 361/724; 454/184; 700/304
(58) Field of Search ................... 361/683, 686, 361/687, 690–695, 699, 700–707, 709–710, 720–729, 802, 803, 816, 818; 257/706–727; 174/15.1, 16.3, 252, 35 R; 454/184; 165/80.2, 80.3, 80.4, 121–122, 106, 106.33, 104, 106.32, 104.33, 185; 360/67 R, 91

(56) References Cited

U.S. PATENT DOCUMENTS

| | | | | |
|---|---|---|---|---|
| 4,568,243 A | * | 2/1986 | Schubert et al. | 415/213.1 |
| 4,971,520 A | * | 11/1990 | Van Houten | 416/169 A |
| 5,000,079 A | * | 3/1991 | Mardis | 454/184 |
| 5,440,450 A | * | 8/1995 | Lau et al. | 361/695 |
| 5,530,202 A | * | 6/1996 | Dais et al. | 174/35 R |
| 5,566,749 A | * | 10/1996 | Jordan et al. | 165/80.3 |
| 5,838,551 A | * | 11/1998 | Chan | 361/818 |
| 5,867,365 A | * | 2/1999 | Chiou | 361/690 |
| 6,037,732 A | * | 3/2000 | Alfano et al. | 318/471 |
| 6,064,571 A | * | 5/2000 | Noble | 361/695 |
| 6,122,169 A | * | 9/2000 | Liu et al. | 361/700 |
| 6,141,213 A | * | 10/2000 | Antonuccio et al. | 361/687 |
| 6,163,454 A | * | 12/2000 | Strickler | 361/695 |
| 6,172,872 B1 | * | 1/2001 | Katsui | 361/695 |
| 6,219,236 B1 | * | 4/2001 | Hirano et al. | 361/695 |
| 6,247,898 B1 | * | 6/2001 | Henderson et al. | 417/3 |
| 6,351,380 B1 | * | 2/2002 | Curlee et al. | 361/695 |
| 6,362,977 B1 | * | 3/2002 | Tucker et al. | 361/818 |
| 6,400,049 B1 | * | 6/2002 | Lai | 310/67 R |

(Continued)

OTHER PUBLICATIONS

Chang JY et al., *Identification of Minimum Air Flow Design for a Desktop Computer Using CFD Modeling*, 2000 Inter Society Conference on Thermal Phenomena, pp. 330–338, 2000.*

Lundquist and Carey, *Microprocessor–Based Adaptive Thermal Control for an Air–Cooled Computer CPU Module*, Seventeenth IEEE Semi–Therm Symposium, pp. 168–173, 2001.*

Yu and Webb, *Thermal Design of a Desktop Computer System Using CFD Analysis*, Seventeenth IEEE Semi–Therm Symposium, pp. 18–26, 2001.*

*Primary Examiner*—Michael Datskovskiy
(74) *Attorney, Agent, or Firm*—Workman Nydegger (57) ABSTRACT

A computing device includes a housing with various electrical and/or mechanical components included therein. Disposed within the housing is a processor assembly that includes a fan. The fan is configured to draw air into the interior of the housing and force air heated by the internal components of the computing device from the interior of the housing. The fan has a diameter that is larger than the smallest dimension of the three orthogonal dimensions of the housing of the computing device and generates low levels of acoustic noise having a low frequency. Additionally, the processor assembly includes a support structure that supports the fan and reduces the effects of electromagnetic emissions generated by a processor of the processor assembly upon electrical devices adjacent to the computing device.

21 Claims, 6 Drawing Sheets

U.S. PATENT DOCUMENTS 6,462,670 B1 * 10/2002 Bolognia et al. ...... 340/815.45
6,526,333 B1 * 2/2003 Henderson et al. ......... 700/300
6,587,337 B2 * 7/2003 Sasaki ........................ 361/687
6,597,972 B2 * 7/2003 Emberty et al. ............ 700/304
6,659,292 B2 * 12/2003 Gough et al. ................. 211/26

* cited by examiner

CONTROLLING THERMAL, ACOUSTIC, AND/OR ELECTROMAGNETIC PROPERTIES OF A COMPUTING DEVICE

BACKGROUND OF THE INVENTION

1. The Field of the Invention

The present invention generally relates to computing devices and their thermal, acoustic, and electromagnetic properties. More specifically, the present invention relates to controlling thermal, acoustic, and/or electromagnetic properties or characteristics of a computing device, while reducing costs associated with manufacturing such a computing device.

2. Background and Related Art

In recent years, there has been significant development in computer technology, ranging from advances in server design, personal and office computers, laptops, personal digital assistants, or the like. These computing devices provide individuals and businesses alike with the ability to perform various functions, obtain entertainment, perform word processing, develop graphics, or the like. Further, many computing devices are capable of providing multimedia entertainment to a viewer, such as set-top boxes, digital video recorders (DVR), personal video recorders (PVR), or the like.

Generally, each type of computing device is designed to operate within a given ambient temperature. For instance, many set-top boxes are designed to operate at an ambient temperature in a range from about 35° C. to about 40° C. To enable operation at such temperatures, computing devices are configured to radiate the heat energy generated by various internal electrical components to the environment external to the computing device. For instance, many computing devices include a power supply that generates a significant amount of heat energy that must be dissipated from the computing device to protect the internal electrical components from overheating.

Additionally, many computing devices include microprocessors that perform various calculations and control the operation of the computing device. As the microprocessor performs such functions, the processor generates heat energy. To dissipate the heat energy generated by the microprocessor, many computing devices include one or more heat sinks mounted to the microprocessor. Each heat sink transfers a portion of the heat generated by the microprocessor to the air surrounding the heat sink. The air surrounding the heat sink is often moved to enhance the convective transfer of heat to the air. In the absence of the forced advection of air in the computing device, the air can become stagnant, which reduces the convective transfer of heat from the heat sink.

Many computing devices utilize fans to draw relatively cool air into the housing of the computing device and expel relatively warm air from the housing. For instance, in many home computers, a first fan is mounted to receive air directly from outside the housing of the computing device and a second fan mounted to the processor and/or heat sink. In such a case, the cooler air is drawn into the computing device, passes over a heat sink mounted to the microprocessor, and is expelled from the computing device. Other computing devices include fans that expel the air from the internal area of the housing.

Unfortunately, such two-fan systems do not efficiently eliminate hot spots within the internal area of the computing device. For instance, the air drawn into and expelled from the housing may not evenly cool internal components or internal areas of the computer, resulting in components or internal areas of the computing device being cooled to a lesser degree than other components or areas of the computing device. Consequently, the components within these hot spots may become damaged from exposure to excessive heat.

Additionally, computing devices with fans mounted to a wall of the housing generate acoustic noise as the fans operate. In an office setting, such acoustic noise may be acceptable to the owner or operator of the computing device. However, within a home environment, such acoustic noise generated by the fan may become irritating to individuals as they utilize the computing device. Illustratively, where the computing device is a set-top box, DVR, or PVR, the acoustic noise associated with the computing device can become distracting to viewers watching broadcast programming that is presented via an associated display device. Furthermore, the inclusion of two fans within a computing device is expensive.

In addition to the above problems with existing computing devices, computing devices generate electromagnetic energy that radiates from the computing device. Such electromagnetic energy can interfere with other electronic devices located in close proximity to the computing device. The amount of such electromagnetic interference (EMI) allowable by each computing device is controlled by government standards. Consequently, computing devices are often designed to suppress, to varying degrees, the EMI generated by the internal components of the computing devices. Typically, the processor of a computing device generates a significant portion of the EMI among the internal components of the computing device.

In light of the above, it would be beneficial to develop a computing device that is capable of eliminating hot spots within the computing device, reducing acoustic noise associated with the cooling mechanisms of the computing device, and/or eliminate or prevent excessive EMI, and do so in a simple, efficient, and cost-effective manner.

BRIEF SUMMARY OF THE INVENTION

The present invention generally relates to computing devices and the thermal, acoustic, and/or electromagnetic properties or characteristics associated therewith. In one embodiment of the present invention, a computing device comprises a housing with various electrical and mechanical components included therein. Illustratively, the housing includes such components as a hard disk assembly, a processor assembly, a motherboard assembly, a power assembly, and a baffle. Formed in the housing are one or more vents that allow air to pass into the interior of the housing and to enable air to be expelled from the housing. The configuration of the computing device can be varied to accommodate differing environments and differing limits upon the thermal energy, acoustic noise, and/or electromagnetic interference generated by the computing device. Consequently, the particular position of the hard disk assembly, the processor assembly, the motherboard assembly, the power assembly, and the baffle are variable to accommodate or result in differing flow paths of the air circulate through the interior of the computing device.

According to one aspect of the invention, the processor assembly draws air into the interior of the housing and forces air heated by the internal components of the computing device from the interior of the housing. Further, the processor assembly reduces the quantity of electromagnetic emissions generated by a processor of the processor assembly. Stated another way, in one embodiment, the processor assembly reduces the potential for electromagnetic interference with other electronic components situated in close proximity to the computing device, whether or not such other electronic components are in contact with or separated from the computing device. In addition, one configuration of the processor assembly encloses the processor and associated heat sink within a support structure within the overall housing of the computing device. This support structure is in turn grounded to the overall housing, thereby reducing the EMI transmitted and/or amplified by the housing.

The heat sink of the processor assembly is adapted to dissipate heat generated by the processor as the processor performs the functions associated with the computing device. Surrounding the heat sink and the processor is the support structure with a fan mounted thereupon. The support structure positions the fan to direct air toward the heat sink and processor or to draw air from the heat sink and the processor. The fan is very close to the processor and heat sink combination, thereby allowing the heat sink to be smaller than otherwise required. Illustratively, in one embodiment, the support structure is configured to direct air toward at least one of a power assembly, a motherboard assembly, and a hard disk assembly, whether or not such air is drawn into the support structure before passing through the fan.

In addition to the above, the fan optionally has a diameter greater than a height dimension of the housing of the computing device. By configuring the fan with a large diameter, a relatively large flow of air is drawn into and forced from the housing of the computing device to cool the components of the computing device using a fan having a relatively low number of revolutions per minute. The relatively low rotational velocity results in a relatively low amount of acoustic noise generated by the fan. Consequently, the computing device generates low acoustic noise.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The present invention relates to systems, methods, and devices for controlling various properties and operating characteristics of computing devices. Embodiments of the present invention provide systems, methods, and devices for controlling thermal properties and operating characteristics of the computing device. Further, embodiments of the present invention provide systems, methods, and devices for controlling the acoustic noise generated by the computing device. Additionally, embodiments of the present invention facilitate controlling the electromagnetic interference effects on other electronic devices that are in close proximity to the computing device. Furthermore, embodiments of the present invention perform one or more of the above-recited functions, thereby providing systems, methods, and devices for controlling thermal properties, acoustic noise, and/or the effects of electromagnetic interference upon other electronic devices. Consequently, embodiments of the present invention enable computing devices to be adapted for use in different locations and environments. For instance, computing devices can be adapted for locations where high ambient temperatures, acoustic noise limitations, and/or EMI restrictions are prevalent.

For purposes of illustration, the present invention will be described herein primarily in the context of a set-top box or other similar device that is used to provide access to broadcast programming received through a cable network, a satellite network, or the like. Such a set-top box is used in close proximity to individuals in the home and is so configured to not affect other electrical appliances or the enjoyment of the individuals utilizing the set-top box to obtain and watch broadcast programming. However, the invention is applicable to a wide variety of computing devices that may benefit from systems, methods, and devices that perform one or more of the functions of controlling thermal properties, reducing acoustic noise, and/or suppressing electromagnetic energy generated by such a computer device. Illustrative computing devices include, but are not limited to, digital video recorders, personal video recorders, game consoles or platforms, personal computers, laptops, personal digital assistants, servers, or other computing devices.

Figure 1:
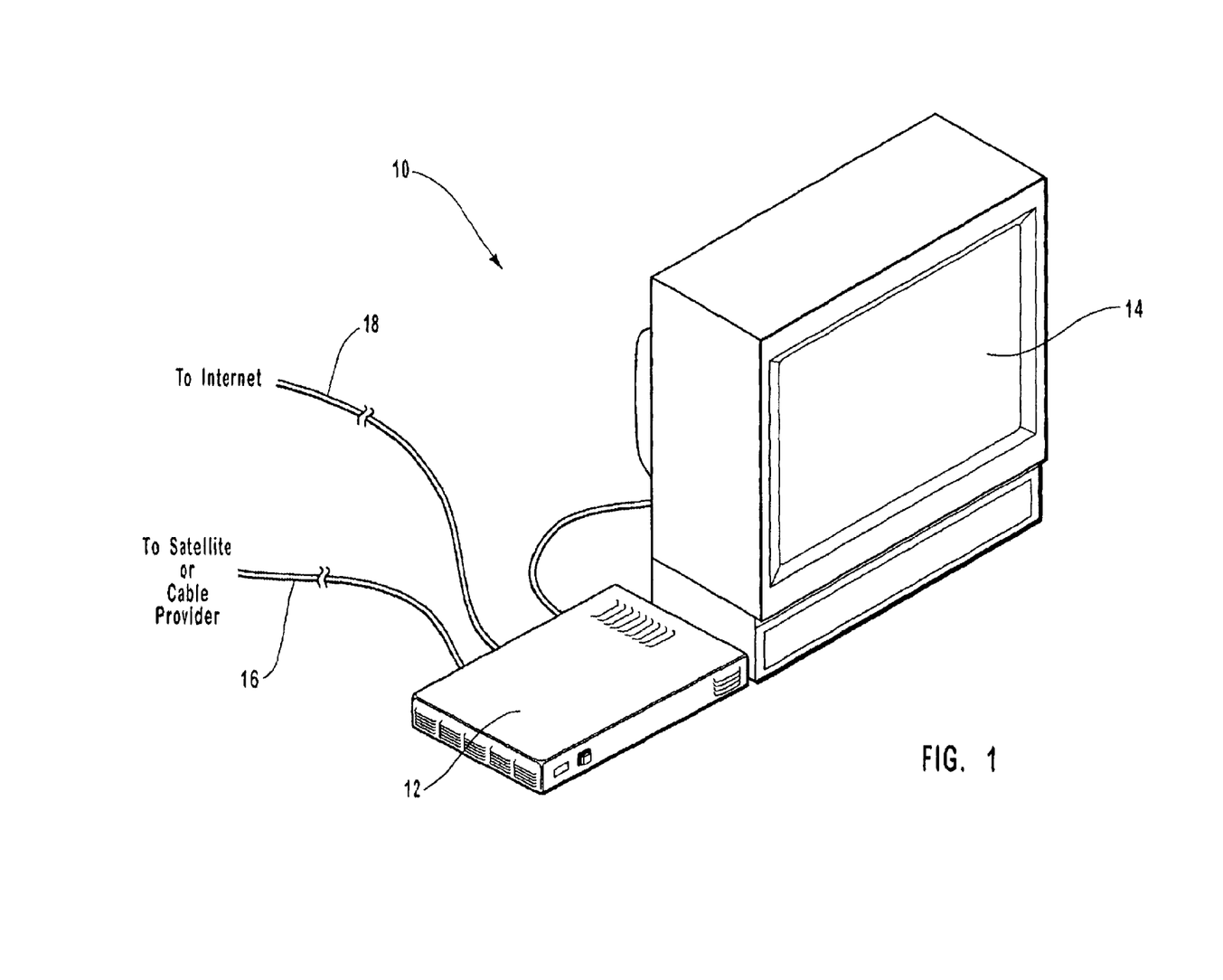
FIG. 1 illustrates an exemplary system according one embodiment of the present invention.

FIG. 1 is a perspective view of an exemplary system within which the features and functions of the present system may be embodied. As illustrated, system 10 includes a computing device 12 connected to a display device 14. As illustrated, computing device 12 is connected to a satellite or a cable provider via a communication line 16 and connected to a wide area network, a local area network, or the Internet by communication line 18. Generally, communication lines 16, 18 can have a variety of different configurations, such as but not limited to, telephone lines, cable lines, wireless transmission lines, microwave transmission lines, or the like, and, in some embodiments, can be combined into a single communication line.

Figure 2:
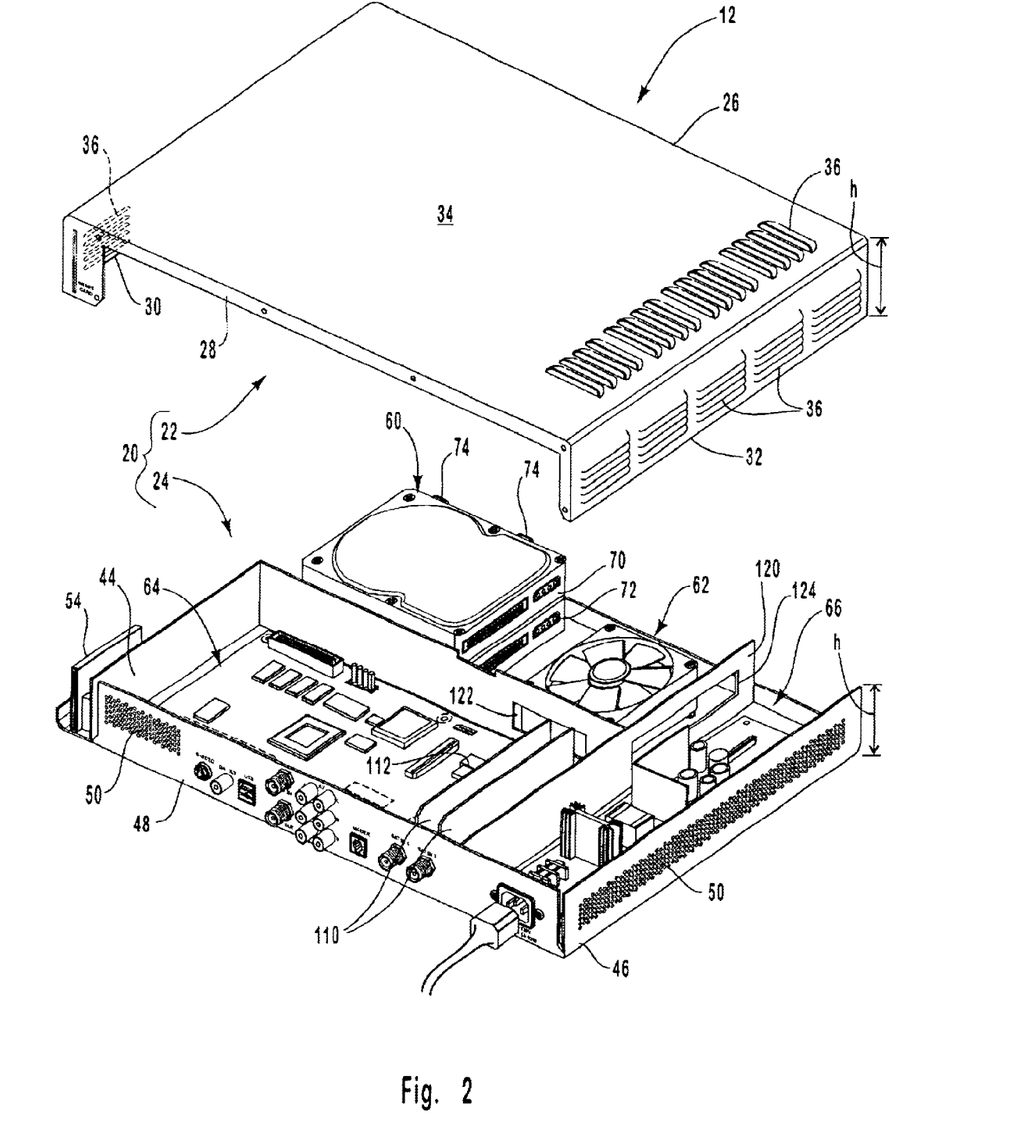
FIG. 2 depicts an exploded perspective view of a computing device of the exemplary system of FIG. 1.

FIG. 2 illustrates an embodiment of computing device 12 and depicts one example of the manner in which the thermal, acoustical, and electromagnetic interference properties of the computing device can be controlled according to the invention. It is understood that the design and configuration of computing devices utilizing the benefits of the present invention vary based upon the environment within which the computing device is used and the particular tolerances of the components employed. The present invention provides illustrative methods, systems, and devices that can be used, either collectively or independently, to vary one or more of the thermal, acoustical, and electromagnetic properties or characteristics of the computing device. For instance, certain computing devices can utilize methods or systems of the present invention to control only thermal properties, while another computing device controls only acoustical or EMI properties using the relevant aspects of the present invention. Consequently, the methods, systems, and devices described herein can be used independently or collectively from one another to effect one or more of the thermal, acoustical, or electromagnetic properties or characteristics of a computing device.

Figure 3:
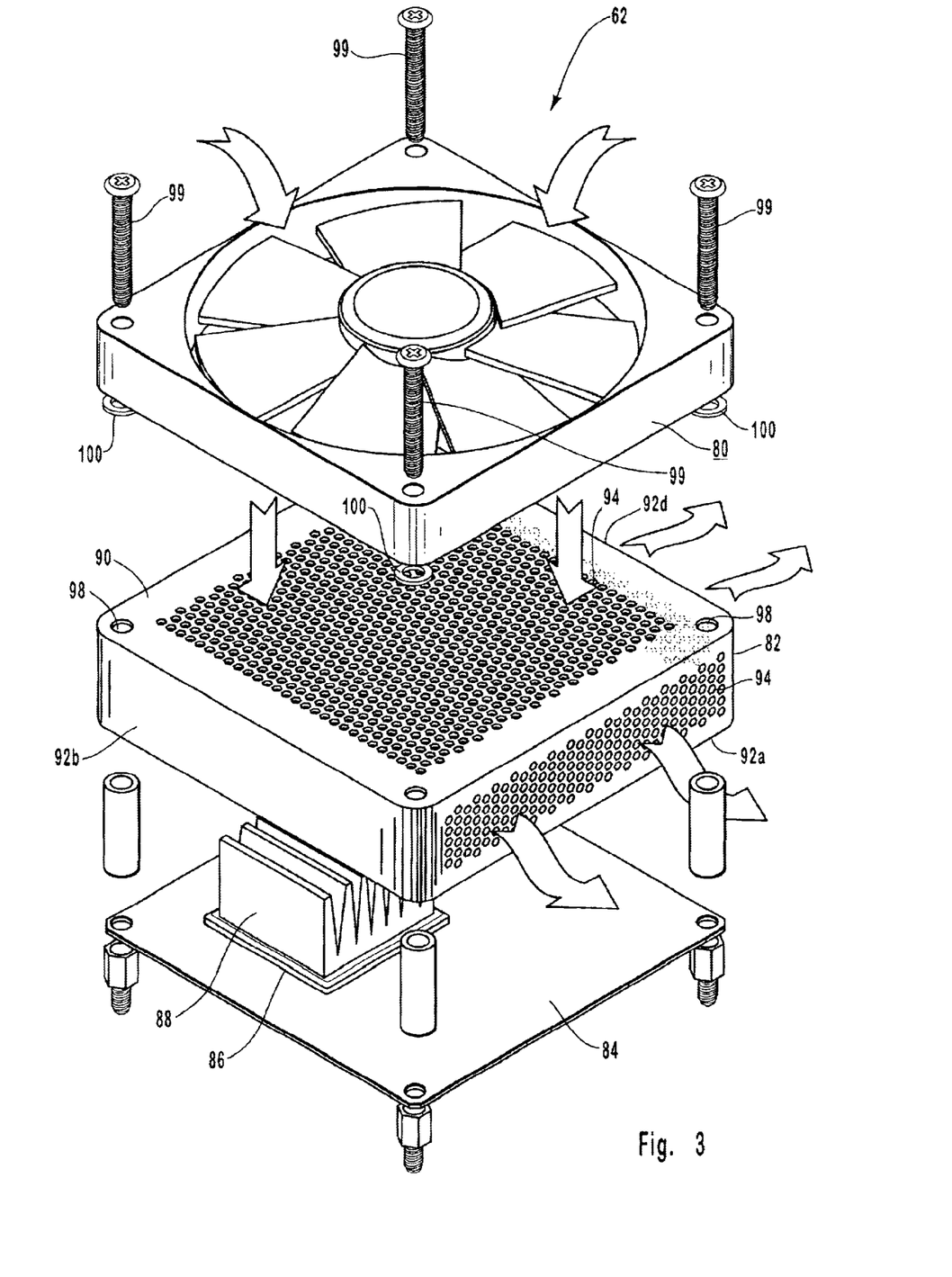
FIG. 3 depicts an exploded perspective view of a processor assembly of the computing device of FIG. 2.

Reference is now made to an illustrative computing device that embodies methods, systems, and devices to effect, to varying degrees, the computing device's thermal, acoustical, and/or electromagnetic properties or characteristics. As illustrated, computing device 12 includes a housing 20 formed from a cover 22 and a carriage 24. Disposed within the interior of housing 20 are various components, including but not limited to, a hard drive assembly 60 and a processor assembly 62, including a fan 80 and a support structure 82 (FIG. 3). Further, housing 20 includes a motherboard assembly 64, a power assembly 66, and a baffle 120. One or more of these components 60, 62, 64, 66, 120 generate the heat, acoustic noise, and electromagnetic energy associated with computing device 12. By varying the placement of assemblies 60, 62, 64, and 66 with respect to one another and baffle 120 within housing 20, one or more of the thermal, acoustical, and electromagnetic properties of computing device 12 can be varied to accommodate differing goals, environments, and safety standards. For instance, by varying one or more dimensions of fan 80, computing device 12 can have differing thermal and acoustical properties. Similarly, by varying the configuration of support structure 82, computing device 12 have differing thermal, acoustical, and electromagnetic properties. Other combinations and resulting effects upon the thermal, acoustical, and electromagnetic properties of computing device 12 will be understood by one skilled in the art based upon the following discussion.

As shown, cover 22 and carriage 24, and hence housing 20, have a height h. Although use of the term "height" of cover 22 or carriage 24, and housing 20, is used herein, height h of housing 20 is the smallest of the three orthogonal dimensions of housing 20, including cover 22 and carriage 24. Thus, the dimension defined as height h is made regardless of the orientation of housing 20 with respect to the surface on which the housing rests. Thus, height h can be horizontal or vertical.

Cover 22 is adapted to slidably or otherwise engage with carriage 24 to form housing 20. Cover 22 includes a top portion 34 with integrally formed or coupled front portion 26, rear portion 28, and/or side portions 30, 32. Disposed through side portions 30, 32 and top portion 34, in this illustrated example, are a plurality of vents 36. Each vent 36 is configured to either allow passage of air into the interior of cover 22 and therefore carriage 24 and/or allow air to be discharged therefrom. Each vent 36 can have various configurations so long as each vent 36 is capable of performing this desired function. For instance, each vent can have an elongate form, can include slanted portions that prevent an individual from placing his fingers within the interior of cover 22 or carriage 24, can include one or more apertures or holes disposed through cover 22, combinations thereof, or the like. Further, vents 36 can take the form of a mesh that covers one or more holes or apertures in housing 20.

Cover 22 can be attached to carriage 24 via one of a variety of different fasteners, such as but not limited to screws, bolts, slit fit fasteners, friction fit fasteners, or the like. Further, cover 22 can lock to carriage 24 through integrally formed fasteners. More generally, the computing device includes means for coupling the cover to the carriage, and the above-described fasteners are exemplary of illustrative structures capable of performing such a function.

Carriage 24 includes a base 48 with a rear wall 42, a sidewall 44, and a sidewall 46 integrally formed therewith or otherwise coupled thereto. As mentioned above, carriage 24 is configured to engage with cover 22. Consequently, carriage 24 can have various configurations, such as different wall or base configurations so long as carriage 24 is adapted to couple with cover 22 to create housing 20. As illustrated, rear wall 42 and sidewalls 44 and 46 are configured with a plurality of vents 50 therethrough. Each vent 50 performs the same function as vents 36 described above, i.e. to allow air to pass therethrough and/or be expelled therefrom, depending on the particular configuration of computing device 12. Similarly, sidewall 44 is configured with a plurality of vents 52.

Following hereinafter is a description of illustrative components or assemblies that can be included within an interior of housing 20. Through varying the particular location and/or configuration of such assemblies or components within housing 20, one or more of the thermal, acoustical, and electromagnetic properties or characteristics of computing device 12 are varied. For instance, by varying the path taken by air flowing through housing 20 and/or the sequence by which different components or assemblies are cooled by the flowing air, differing thermal properties are created. Similarly, by varying the amount and frequency of noise created by computing device 12, the acoustical properties of computing device 12 are changed. Further, the degree to which computing device 12 limits the effects of EMI upon other electrical appliances that contact or are adjacent to computing device 12 can be varied through varying the configurations of one or more of the assemblies or components of computing device 12.

In this illustrative embodiment, attached to base 48 is a smart card 54. Smart card 54 is adapted to enable computing device 12 to display certain types of broadcast programming, while preventing the display of other types of broadcast programming. For instance, when computing device 12 is a set-top box that communicates with a cable or satellite provider, smart card 54 can govern the type of programming decoded by computing device 12 and displayed to a viewer, such as pay-per-view, premium channels, or the like. Various configurations of smart card 54 are known by those skilled in the art. For instance, smart card 54 can take the form of a card receiver adapted to receive a smart card that defines the broadcast programming displayable to the viewer.

As mentioned above, disposed within the interior of carriage 24 is processor assembly 62. Processor assembly 62 generates a substantially quantity of the heat energy, acoustic noise, and electromagnetic energy associated with computing device 12. This heat energy, acoustic noise, and electromagnetic energy is generated and limited by one or more of the components or elements forming part of processor assembly 62. By changing the configuration of processor assembly 62, the thermal, acoustical and electromagnetic properties or characteristics of computing device 12 can be varied.

Figure 4:
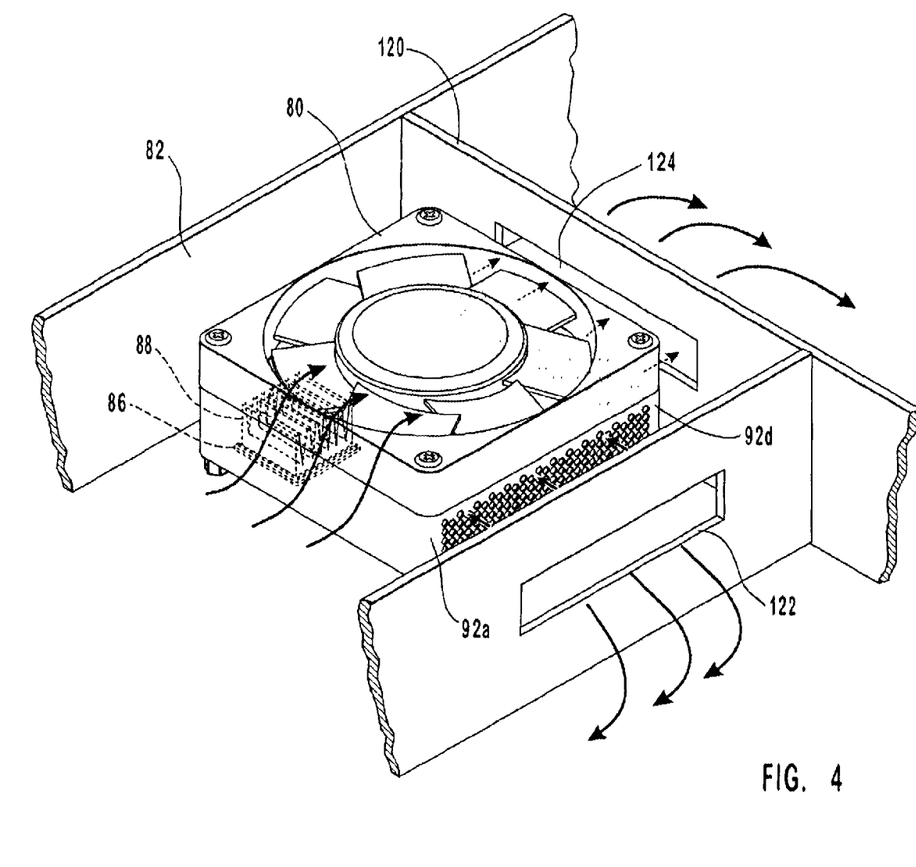
FIG. 4 illustrates still another embodiment of air flowing through a processor assembly of the system of FIG. 1.

With reference to FIGS. 3 and 4, processor assembly 62 includes a heat sink 88 mounted to a processor 86, the heat sink 88 and processor 86 being surrounded by support structure 82. The processor 86 generates a significant amount of heat energy during the operation and use of computing device 12. This heat is transferred from processor 86 to heat sink 88. The heat sink 88 dissipates the heat energy to the air surrounding processor 86 and heat sink 88 to prevent damage to processor 86 from lengthy exposure to the heat it generates. By varying the surface area of heat sink 88, various quantities of heat energy can be transferred to the surrounding air. Varying the surface area can be achieved through varying the length and number of fins included as part of heat sink 88. As illustrated, heat sink 88 includes seven fins, however, other embodiments of the present invention can include a greater or lesser number of fins. Further, by varying the length of each fin, i.e., increasing the height and/or length dimension of heat sink 88, a greater or lesser amount of heat energy is transferred to the air passing over heat sink 88.

Another manner to vary the heat dissipated by heat sink 88 is to vary the quantity and speed of air passing heat sink 88. The more air passing heat sink 88, the greater the quantity of heat energy that can be transferred to the air and the cooler processor 86 and heat sink 88. Changes in the quantity and/or speed of the air flowing past heat sink 88 are controlled by fan 80 and optionally support structure 82.

The fan 80 is mounted to support structure 82. Fan 80 draws air from outside of housing 20 toward processor 86 and heat sink 88 and forces the air from within housing 20 of computing device 12. The properties of fan 80 affect the thermal and acoustic characteristics and properties of computing device 12. For instance, the amount of air moved into and out of the interior of housing 20 is based upon the blade area of fan 80 and the operating revolutions per minute (RPM) of the fan blades. For instance, a fan with a large blade area has a higher cubic feet per minute (CFM) flow rate than a fan with a small blade area rotating at the same RPM. Similarly, a fan with a high RPM has a higher CFM flow rate than an identical fan with a low RPM. By varying the blade area and RPM of fan 80, differing CFM flow rates are achieved. These differing flow rates change the thermal characteristics of computing device 12. For instance, if the CFM is too low, heat sink 88 dissipates a low amount heat generated by processor 86, potentially resulting in damage to processor 86. Further, in the event that the CFM is too low hot spots can occur within the interior and/or exterior of computing device 12; resulting in damage to internal components or assemblies of computing device 12 with the resultant decrease in performance or operation of computing device 12.

The blade configuration and RPM of the fan also affects the acoustical characteristics of computing device 12. The acoustical noise generated by the fan is directly proportional to the rotational velocity of the fan, i.e., the RPM. Hence, a fan rotating with a high RPM creates a greater amount of acoustical noise than the same fan rotating at a low RPM. Further, the frequency of the acoustical noise created by a high RPM fan is higher than a low RPM fan. This low frequency acoustical noise is typically less distracting and noticeable than the higher frequency noise. Illustratively, fan 80 produces acoustic noise having an intensity in the range of about 28 dB to about 35 dB, and more preferably, in the range of about 25 dB to about 30 dB. In any of the foregoing ranges, the fan exhibits a low acoustic signature.

Consequently, the configuration of fan 80 is selected based on a variety of different variables, such as, but not limited to, the volume flow rate of air moved by the fan, the static pressure associated with the fan, the acoustic noise generated by the fan, the physical dimensions of the fan, and the like. In one configuration, therefore, fan 80 has a diameter larger than the height dimension h of housing 20. In this manner, the irritating and distracting high frequency acoustic noise typical for cooling fans is eliminated, while fan 80 maintains a high volume flow rate of air through the interior of housing 20 to cool the various assemblies and electrical components included therein. In another configuration, fan 80 has a diameter equal to or greater than the height dimension h of housing 20. In still another configuration, where no control of the acoustic noise of computing device 12 is necessary, fan 80 has a diameter less than the height dimension h of housing 20; thus resulting in high frequency noise.

To aid in further reducing acoustic noise generated by fan 80, fan 80 is optionally isolated from support structure 82 through dampening members 100. The dampening members 100 prevent oscillating motion of fan 80 from transferring to support structure 82 and to housing 20. Therefore, acoustic noise that could be generated by and amplified by support structure 82 and housing is suppressed. Further, to reduce acoustic noise, fan 80 is located within the interior of housing 20, without fan 80 directly contacting any portion of housing 20 and/or receiving air directly from the exterior of housing 20. Stated another way, fan 80 receives air drawn into the interior of housing 20 that has passed over or around at least one of a hard disk assembly, a motherboard assembly, or a power supply assembly before the air reaches fan 80. By so positioning fan 80, the sound waves associated with the acoustic noise generated by fan 80 are disrupted by the other components and assemblies of computing device 12 before the sound waves exit computing device 12, thereby reducing the intensity of acoustic noise, measured for example in decibels, that can be heard by an individual in close proximity to computing device 12.

Fan 80 can have various configurations as known to one skilled in the art. For instance, the fan can be an air-bearing fan, a sleeve-bearing fan, an oil-bearing fan, a brushless fan, a ball-bearing fan, or the like. Additionally, fan 80 can be either a constant speed fan or a variable speed fan. Although the above are provided as illustrative examples of various fans, one skilled in the art in light of the teaching contained herein can identify various other fans capable of performing the desired function.

Supporting fan 80 and substantially surrounding processor 86 and heat sink 88 is support structure 82. A height dimension of support structure 82 is sufficiently large that support structure 82 can surround processor 86 and heat sink 88, while mounting to base 48 of carriage 24 through one or more fasteners. In other embodiments, support structure 82 partially encloses processor 86 and heat sink 88.

As shown in FIGS. 3 and 4, support structure 82 has a generally polygonal form with an upper portion 90 and side portions 92a–92d. Disposed within upper portion 90, side portion 92a, and side portion 92d are a plurality of apertures 94. Each aperture 94 has a generally polygonal form, resulting in a honeycomb-type configuration. These apertures 94 are adapted to allow air to flow therethrough and to limit the propagation of electromagnetic energy generated by processor 86. Consequently, in one embodiment, apertures 94 perform the dual function of allowing air to pass through, while limiting and/or suppressing the propagation of electromagnetic energy caused by processor 86. Although apertures 94 are depicted as being polygonal in shape and configuration, other shapes, size, and configurations can be used so long as apertures 94, individually and collectively, perform one or more of the functions of allowing air to pass therethrough and/or preventing or limiting the propagation of electromagnetic energy.

Alternate configurations of apertures 94 can vary the effects on one or more thermal, acoustical, and/or electromagnetic properties of computing device 12. For instance, apertures 94 can be configured solely to allow air to pass therethrough, without limiting the propagation of electromagnetic energy; resulting in a computing device that does not limit EMI to varying degrees. Alternatively, apertures 94 can be configured solely to allow air to pass therethrough, while a mesh screen surrounds apertures 94 to limit the propagation of electromagnetic energy caused by processor 86. In still other configurations, apertures 94 can be configured solely to limit the propagation of electromagnetic energy, while potentially retarding the flow of air therethrough; resulting in a computing device that may have elevated thermal properties or characteristics. As can be seen, varying the ability of apertures 94 to perform one or both of the desired functions, i.e., allowing air to pass and limiting the propagation of electromagnetic energy, results in variations in one or more of the thermal, acoustical, and electromagnetic properties of computing device 12.

Further disposed within upper portion 90 is a plurality of fastener holes 98. Each fastener hole 98 receives a fastener 99 that securely connects or couples fan 80 to support structure 82 and optionally securely mounts support structure 82 to mounting member 84 and/or base 48 of carriage 24. Any of a variety of fasteners can be used to make such connections, while including appropriate dampening member 100 to reduce the transfer of acoustical noise generated by fan 80 to housing 20 or other internal assemblies or components of computing device 12. Although reference is made to utilizing a dampening member 100 to reduce the transfer of acoustical noise, it can be appreciated that alternate embodiments of processor assembly 62 can be devoid of such dampening member 100. By eliminating dampening member 100, the computing device may have higher acoustical characteristics than another computing device that includes dampening member 100.

Support structure 82 can be fabricated from a variety of different materials such as metals, composites, or the like, so long as the material has sufficient strength to support fan 80 and optionally limits the propagation of electromagnetic energy resulting in EMI.

Figure 5:
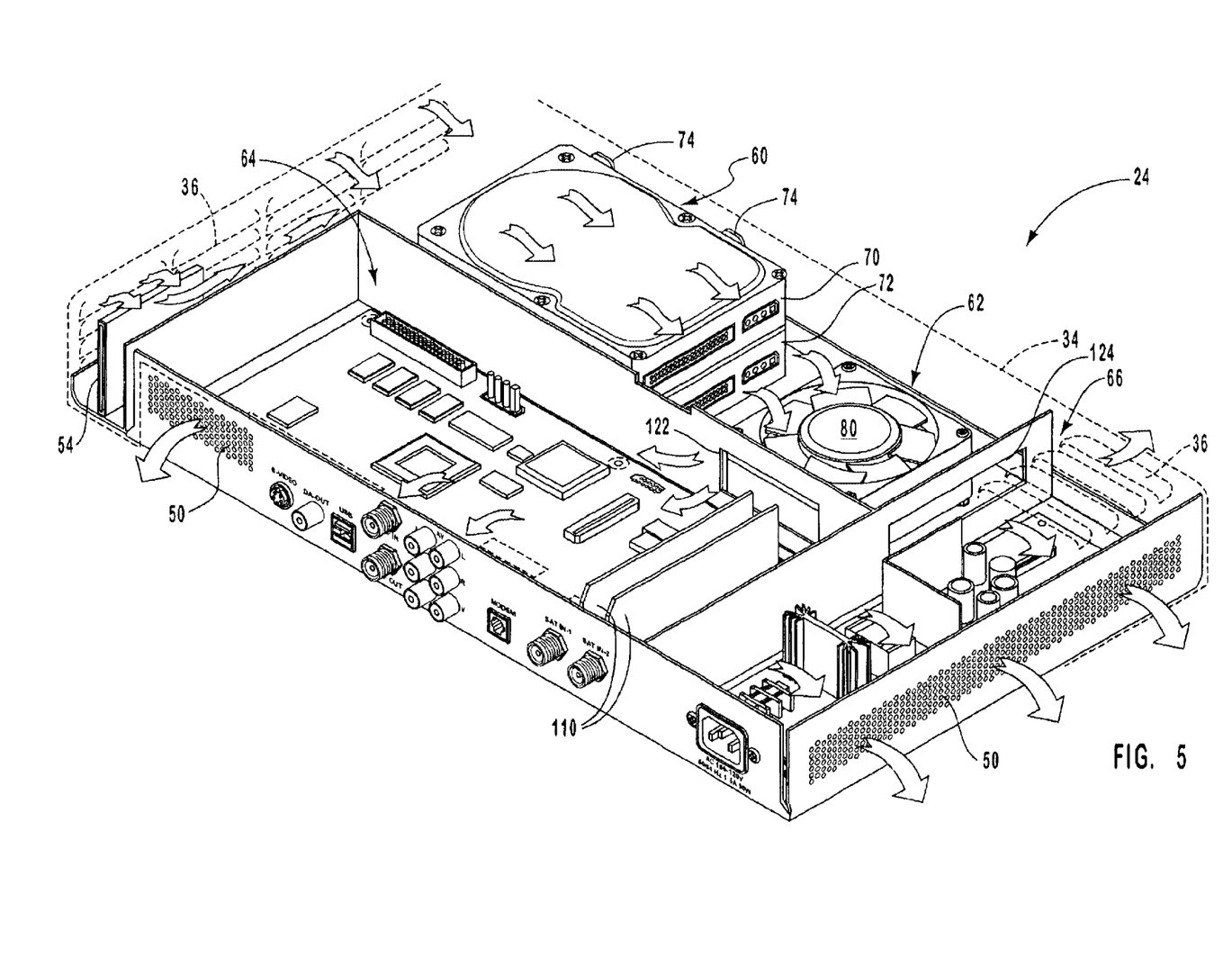
FIG. 5 illustrates one embodiment of the manner by which the air flows through the computing device of FIG. 2.
Figure 6:
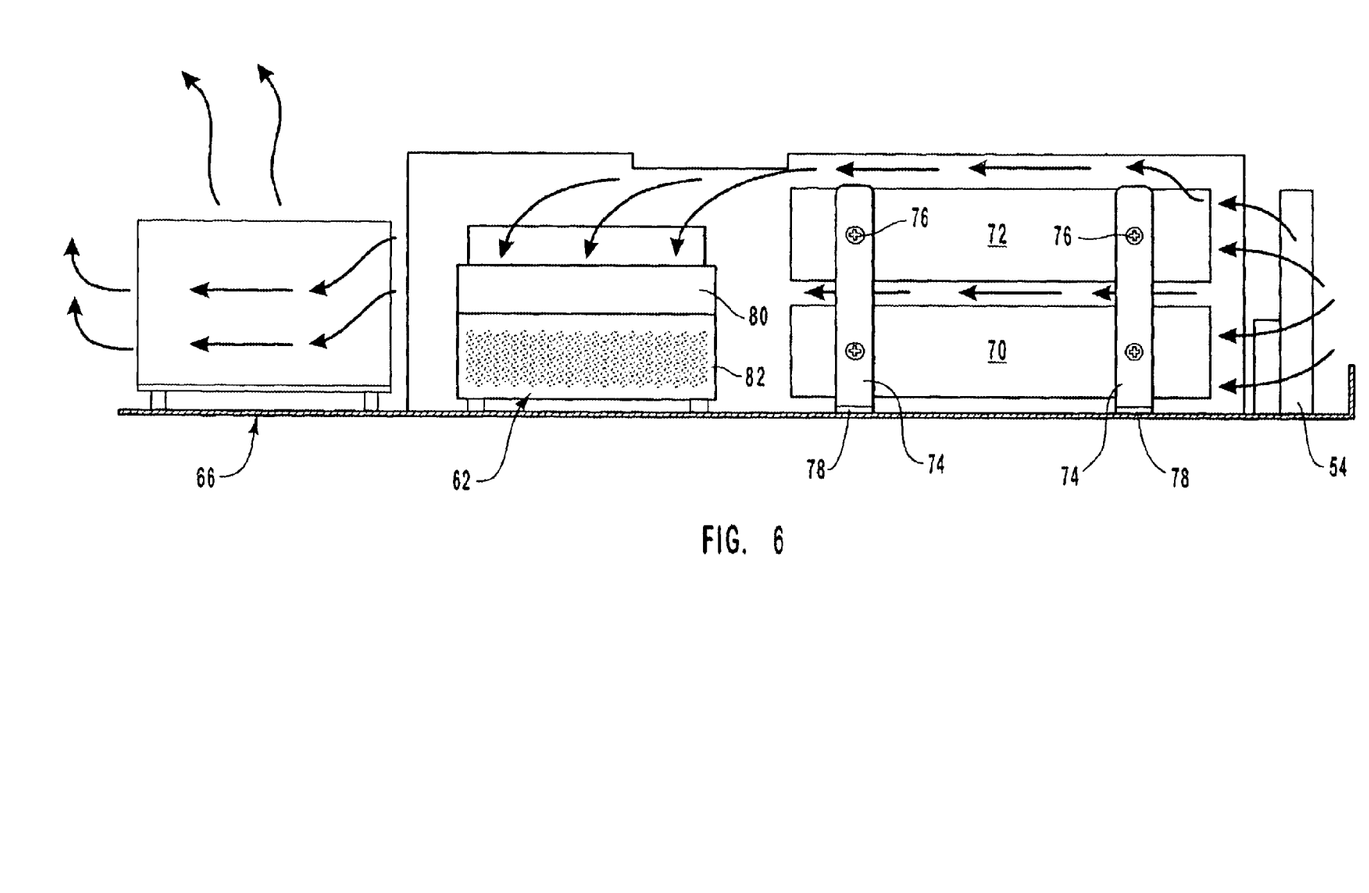
FIG. 6 illustrates a cross-sectional side view of the computing device of FIG. 2.

Since fan 80 functions to draw air into and force air from within housing 20 of computing device 12, the placement of fan 80 and the remainder of processor assembly 62 have an effect upon the thermal, acoustical, and electromagnetic characteristics and properties of computing device 12. For instance, by shielding processor 86 and heat sink 88 with support structure 82, the propagation of electromagnetic energy to the exterior of computing device 12 is limited. Similarly, by placing fan 80 so that the fastest moving air passes over processor 86, a greater amount of heat energy is transferred to the air than would be possible if slower moving air passes processor 86 and heat sink 88. Additionally, as illustrated in FIGS. 5 and 6, the particular location of processor assembly 62 is such that fan 80 draws the coolest air over smart card 54 and hard disk assembly 60 through vents 36 and 52. In this manner, smart card 54 and hard disk assembly 60, both of which generate large amounts of heat energy, are cooled with the coolest air, thereby substantially reducing the internal temperature of computing device 12.

It is also noted that fan 80, in this exemplary configuration, has an axis of rotation that is substantially parallel with the height h of housing 20. Aligning the axis of rotation of fan 80 in this manner enables the fan to be positioned in housing 20 without the diameter of the fan physically interfering with housing 20. In contrast, if fan 80 were to be positioned such that the axis of rotation was perpendicular to height h, the fan 80 would not fit within housing 20.

The position of fan 80 within housing 20 can also be characterized in terms of the orientation of the axis of rotation with respect to the general plane of motion of the air moved by the fan. As shown in FIG. 2 and as further described below in reference to FIGS. 3–6, air flows through apertures in the sidewalls of housing 20 and through housing 20 primarily, but not completely, in a plane that is perpendicular to the height h of housing 20. Although this is the case, other alternate embodiments of the present invention can have air flows that are in a plane parallel to the height h of housing 20.

In addition to the above assemblies, carriage 24 accommodates baffle 120. Baffle 120 is adapted to control the movement of air as the air passes into the interior of housing 20 and exits from housing 20. As shown, in FIGS. 2 and 4, baffle 120 is T-shaped, but can instead be L-shaped or have other shapes that define chambers within housing 20 and between which air forced by fan 80 flows. Baffle 120 includes aperture 122 and aperture 124. Each aperture 122 and 124 is configured to allow air from processor assembly 62 to be directed therethrough toward other assemblies of computing device 12, such as but not limited to, motherboard assembly 64 and power assembly 66. With each aperture 122 and 124 being the only way for air to flow from fan 80 to motherboard assembly 64 and power assembly 66, baffle 120 prevents air from circulating back to processor assembly 62 and hard disk assembly 60. Consequently, the air that has been heated by the heat energy dissipated by heat sink 88 is directed out of housing 20.

Baffle 120 can be fabricated from a variety of different materials such as plastic, metals, composites, or the like. Various other materials are applicable so long as they can be formed into the desired configuration that enables air to pass therethrough while controlling the flow direction of the air.

Returning to FIG. 2, as mentioned above, disposed within the interior of carriage 24 is hard drive assembly 60. Hard drive assembly 60 provides storage for data deliverable to computing device 12 from the cable or satellite provider and or the Internet. Consequently, and with reference to FIGS. 2 and 6, hard drive assembly 60 includes two hard disks 70 and 72 and a bracket 74 to securely retain hard disks 70 and 72 within carriage 24. The bracket 74 and associated fasteners 76, 78 attach hard disks 70 and 72 to base 48 of carriage 24 (FIG. 5) in such a manner to reduce the transfer and amplification of acoustical noise generated by hard disks 70 and 72. For instance, each fastener 76 and 78 can take the form of a screw with an associated washer or other appropriate means for coupling one element to another element, while limiting the transfer of acoustical noise. One skilled in the art, in light of the teaching contained herein, can identify various other structures capable of performing the function associated with the means for coupling one element to another element 4 and subsequently housing 20.

As illustrated, hard disks 70 and 72 are centered within the interior of carriage 24. More specifically, a space is provided between each hard disk 70 and 72 and between respective hard disks 70 and 72 and either cover 22 or base 48 when cover 22 is connected to carriage 24 to form housing 20. In this manner, air is allowed to freely move around hard disks 70 and 72 and cool hard disks 70 and 72 in an efficient manner. It can be appreciated that hard disks 70 and 72 need not be centered within the height dimension of housing 20, but may be disposed in closer proximity to base 48 than to cover 22 when cover 22 is connected to carriage 24. Alternatively, hard disk 70 and 72 can be disposed in closer proximity to cover 22 instead of to base 48 when cover 22 is connected to carriage 24. Further, hard disks 70 and 72 can contact one another. Each change in the position and location of hard disks 70 and 72 results in an associated change in the thermal, acoustical, and/or electromagnetic properties of computing device 12. For instance, when hard disks 70 and 72 are contacting one another, less air flows past each hard disk 70 and 72 to reduce the temperature of hard disks 70 and 72. Therefore, the internal temperature of computing device 12 increases. Further, in the event that hard disks 70 and 72 are not acoustically dampened through the manner by which they are attached to housing 20, the acoustically properties of computing device 12 are varied.

Returning to FIG. 2, motherboard assembly 64 includes one or more tuner cards 110 and a controller 112. Each tuner card 110 is configured to receive a signal from the cable or satellite provider through an appropriate hardware connection.

In addition to tuner cards 110, motherboard assembly 64 includes a controller 112 that controls the speed of fan 80. For instance, when fan 80 is a variable speed fan, controller 112 is configured to receive data indicative of the temperature within housing 20 and vary the rotational velocity of fan 80 based upon this detected temperature. Illustratively, motherboard assembly 64 can include a thermocouple or other electric circuitry, mechanical device, or the like, which detects the current internal temperature of housing 20. Controller 112, processor 86 and/or another processor compares the current internal temperature data against data indicative of a desired internal temperature and identifies the change in rotational velocity of the fan that may be needed to reduce the current internal temperature to the desired internal temperature. If it is determined that the current internal temperature is too high, controller 112 increases the rotational velocity of fan 80 to effect the reduction in temperature. Similarly, when the current internal temperature is lower than the desired internal temperature, controller 112, processor 86, and/or processor can reduce the rotational velocity of fan 80 or stop fan 80 altogether.

Motherboard assembly 64 can include various other components that are typical of a computing device, such as but not limited to other processors, memory, output ports and input ports for television, computers, telephone lines, or the like. Such additional components are known to those skilled in the art and may vary based on the particular operation and function of the computing device 12. Similarly, power assembly 66 includes the power supply with associated internal components and external ports as known by those skilled in the art.

As discussed, the particular location of the various different assemblies and components of computing device 12 can vary one or more of the thermal, acoustical, and electromagnetic properties and/or characteristics of computing device 12. Depending on the particular environment where computing device 12 is to be used, computing device 12 can be configured to maintain the internal components at a desired temperature, generate different levels and frequencies of audible and inaudible noise, and/or limit, to varying degrees, the electromagnetic interference affects upon electrical devices and components situated adjacent to or contacting computing device 12. Illustrated in FIGS. 3–6 is an exemplary air flow path through computing device 12 that attempts to accommodate and/or control one or more of the thermal, acoustical, and electromagnetic effects of computing device 12. Although discussion is made of one exemplary air flow, one skilled in the art can identify various other air flows that result in control of one or more of the thermal, acoustic, and/or electromagnetic energy properties or characteristics of the computing device.

As illustrated, air passes through vents 36 of housing 20 into interior portion of housing 20. The coolest air is drawn over smart card 54 and through vents 50 into hard disk assembly 60. Since hard disks 70 and 72 are separated by brackets 74, air passes over and below hard disks 70 and 72 toward processor assembly 62. Fan 80 forces high velocity air to pass over heat sink 88 (FIG. 3). The heat sink 88 transfers the heat energy generated by processor 86 to the passing air to cool processor 86. The air is directed by apertures 94 through aperture 122 of baffle 120 into an area containing motherboard assembly 64. In addition, the air is forced toward power assembly 66 through aperture 124 in baffle 120. Fan 80 forces the air to move past motherboard assembly 64 to exit from housing 20 through vents 36 and 50. Further, fan 80 forces the air to flow from vents 36 in top portion 34 of cover 22 as the air passes over power assembly 66.

Since air passes over each component or assembly of computing device 12 in a structured and controlled manner, without the potential for fan 80 drawing heated air back into the interior of housing 20, hot spots that would otherwise exist within housing 20 are reduced or substantially eliminated. Therefore, the components and assemblies of computing device 12 are protected from damage from excessive heat.

Further, the assemblies that generate the greatest amount of heat energy or are most sensitive to exposure to high temperatures are cooled with the coolest air drawn from outside computing device 12 or are cooled using higher velocity air. For instance, the air having an ambient temperature is first drawn over smart card 54 and hard disks 70 and 72, while air with the highest velocity passes over processor 86 and associated heat sink 88 (FIG. 3). Alternatively, the air with the highest velocity passes over one or more of smart card 54, hard disks 70 and 72, motherboard assembly 64, or the like, while the coolest air passes over processor 86 and associated heat sink 88.

As can be understood from the proceeding discussion, different air flow patterns and alternate cooling sequences for cooling the internal components and assemblies of the computing device are created by varying the position of internal components and assemblies. Each alternate configuration of the computing device can control or limit one or more of the thermal, acoustic, and electromagnetic energy properties or characteristics of the computing device. For instance, alternate airflow patterns can cool the internal components in alternate sequences. Similarly, the location and/or configuration of the fan can be varied to provide varied cooling effects and acoustic noise. Further, the effectiveness of the support structure in limiting or controlling the EMI of the computing device can be varied through changing the configuration of the support structure or eliminating the support structure from the computing device. One skilled in the art, in light of the teaching contained herein, can identify different flow paths and component or assembly locations, to be used to achieve a desired effectiveness of the computing device to control or limit one or more of the thermal, acoustic, and/or electromagnetic properties or characteristics of the computing device.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computing device comprising:
   a housing adapted to receive at least one processor, wherein said housing further comprises a baffle that is configured to direct air flowing from a fan mounted within the housing, and wherein said baffle comprises at least one aperture for allowing air to flow from said fan;
   said fan having a low operational velocity and a correspondingly low acoustic signature of less than about 36 dB, the acoustic signature being proportional to the operational velocity of the fan, the fan also having a diameter that is configured in size for enabling the fan to cool the at least one processor at the low operational velocity; and
   a support structure for mounting said fan within said housing and for limiting electromagnetic interference caused by said at least one processor.

2. A computing device as recited in claim 1, wherein the fan has an axis of rotation substantially parallel to a height of the housing.

3. A computing device as recited in claim 1, wherein said housing is adapted to receive at least one of a power supply assembly, a hard drive assembly, and a mother board assembly.

4. A computing device as recited in claim 1, wherein said housing comprises a cover and a carriage, both said cover and said carriage comprises a plurality of vents.

5. A computing device as recited in claim 1, wherein said fan is a fan selected from the group consisting of a ball bearing fan, a sleeve bearing fan, and a oil bearing fan.

6. A computing device as recited in claim 1, wherein said fan is a variable speed fan.

7. A computing device as recited in claim 1, wherein support structure is configured to suppress electromagnetic energy generated by a processor.

8. A computing device as recited in claim 1, wherein the support structure comprises a plurality of holes that are each configured to allow air to flow therethrough.

9. A computing device as recited in claim 1, further comprising at least one dampening member disposed between said fan and said support structure, said at least one dampening member acoustically dampening said fan from said housing.

10. A computing device as recited in claim 1, wherein said housing comprises a plurality of vents, at least one of said plurality of vents being disposed in at least one of a back portion, a front portion, a side portion, and a top portion of said housing.

11. A computing device comprising:
   a housing having a height;
   a processor positioned in the housing;
   a smart card;
   a fan mounted within said housing, said fan being mounted within said housing such that the fan draws air from outside the housing over the smart card and then over the processor; and
   a support structure for mounting said fan within said housing and for suppressing electromagnetic interference caused by said at least one processor.

12. A computing device as recited in claim 11, wherein the housing comprises a cover and a carriage.

13. A computing device as recited in claim 11, wherein the fan has an axis of rotation substantially parallel to a height of the housing.

14. A computing device as recited in claim 11, wherein selection of the fan is based upon at least one of (i) the flow rate or air moved by the fan, (ii) the static pressure associated with the fan, (iii) the acoustic noise generated by the fan, and (iv) the physical dimensions of the fan.

15. A computing device as recited in claim 11, wherein support structure comprises a plurality of apertures therethrough.

16. A computing device as recited in claim 15, wherein the support structure is adapted to suppress electromagnetic energy generated by the at least one processor.

17. A computing device as recited in claim 16, wherein at least one plurality of apertures is configured to direct air drawn by the means for drawing to at least one of a motherboard assembly, a power assembly, and a hard disk assembly retained within the means for retaining.

18. A computing device as recited in claim 11, further comprising a baffle configured to direct the air drawn by the means for drawing.

19. A computing device as recited in claim 18, wherein the baffle has an L-shaped configuration.

20. A computing device as recited in claim 18, wherein the baffle has a T-shaped configuration.

21. A computing device as recited in claim 18, wherein the baffle comprises at least one aperture adapted to allow air to flow through the baffle.

* * * * *